(12) United States Patent
Wan et al.

(10) Patent No.: US 11,043,956 B1
(45) Date of Patent: Jun. 22, 2021

(54) ANALOG TO DIGITAL CONVERTING SYSTEM, TIME-SKEW CALIBRATION METHOD, AND RELATED COMPUTER PROGRAM PRODUCT

(71) Applicants: GLOBAL UNICHIP CORPORATION, Hsinchu (TW); TAIWAN SEMICONDUCTOR MANUFACTURING CO., LTD., Hsinchu (TW)

(72) Inventors: Shao-Hua Wan, Hsinchu (TW); Ting-Hao Wang, Hsinchu (TW); Yu-Chu Chen, Hsinchu (TW)

(73) Assignees: GLOBAL UNICHIP CORPORATION, Hsinchu (TW); TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/037,574

(22) Filed: Sep. 29, 2020

(30) Foreign Application Priority Data

Apr. 29, 2020 (TW) .................................. 109114383

(51) Int. Cl.
  *H03M 1/10* (2006.01)
  *H03M 1/12* (2006.01)
  *H03M 1/08* (2006.01)
(52) U.S. Cl.
  CPC ......... *H03M 1/1028* (2013.01); *H03M 1/121* (2013.01); *H03M 1/1215* (2013.01); *H03M 1/0836* (2013.01); *H03M 1/1023* (2013.01)

(58) Field of Classification Search
  CPC ............ H03M 1/0836; H03M 1/1023; H03M 1/1028; H03M 1/1033; H03M 1/121; H03M 1/1215
  USPC .......................................... 341/118, 120, 155
  See application file for complete search history.

(56) References Cited

U.S. PATENT DOCUMENTS

| | | | |
|---|---|---|---|
| 8,159,377 B2* | 4/2012 | Goldman | H03M 1/0624 341/118 |
| 9,294,112 B1* | 3/2016 | Devarajan | H03M 1/0836 |

\* cited by examiner

*Primary Examiner* — Khai M Nguyen
(74) *Attorney, Agent, or Firm* — CKC & Partners Co., LLC

(57) ABSTRACT

An analog-to-digital converting system includes multiple stages of analog-to-digital converters (ADCs) and a skew calibration circuit. The multiple stages of ADCs are configured to sample a test signal according to multiple interleaved clock signals, respectively, so as to respectively generate multiple stages of quantized outputs. The analog-to-digital converting system has a sampling frequency resulting from operations of the multiple stages of ADCs. The test signal has a first frequency and the sampling frequency is N times the first frequency, and N is an odd number larger than 1. The skew calibration circuit is configured to sequentially analysis, for every N stages, the multiple stages of quantized outputs to generate multiple digital codes. The skew calibration circuit is further configured to calibrate a time skew of the analog-to-digital converting system according to a comparison result between the multiple digital codes and a reference code.

20 Claims, 6 Drawing Sheets

ANALOG TO DIGITAL CONVERTING SYSTEM, TIME-SKEW CALIBRATION METHOD, AND RELATED COMPUTER PROGRAM PRODUCT

RELATED APPLICATION

The present application claims priority to Taiwan Application Serial Number 109114383, filed Apr. 29, 2020, which is incorporated herein by reference in its entirety.

BACKGROUND

Technical Field

The present disclosure relates to an analog-to-digital converting system. More particularly, the present disclosure relates to an analog-to-digital converting system, time-skew calibration method and related computer program product without the need for an additional reference circuit as a calibration reference.

Description of Related Art

With the development of various communication technologies and the improvement of hardware specifications, requirements for resolution and operating speed of signal analog-to-digital conversion have also increased. Limited by process factors, the operating speed of traditional single-channel analog-to-digital converters has reached a development bottleneck, so that time-interleaved analog-to-digital converters whose operating speed is positively correlated with the number of channels have attracted attention.

SUMMARY

One aspect of the present disclosure is to provide a time-skew calibration method configured to calibrate an analog-to-digital converting system, in which the analog-to-digital converting system includes multiple stages of analog-to-digital converters (ADCs) operating according to multiple interleaved clock signals, respectively, and the time-skew calibration method includes: using the analog-to-digital converting system to sample a test signal with a sampling frequency such that the multiple stages of ADCs generate multiple stages of quantized outputs, respectively, in which the test signal has a first frequency, and the sampling frequency is N times the first frequency, where N is an odd number larger than 1; sequentially analyzing the multiple stages of quantized outputs for every N stages to generate multiple digital codes; and calibrating a time skew of the analog-to-digital converting system according to a comparison result between the multiple digital codes and a reference code.

Some aspects of the present disclosure provide an analog-to-digital converting system, which includes multiple stages of analog-to-digital converters and a time-skew calibration circuit. The multiple stages of ADCs are configured to sample a test signal, respectively, according to multiple interleaved clock signals so as to generate multiple stages of quantized outputs, respectively, in which an operation of the multiple stages of ADCs renders the analog-to-digital converting system have a sampling frequency having a first frequency, and the sampling frequency is N times the first frequency, where N is an odd number larger than 1. The time-skew calibration circuit is configured to sequentially analyze the multiple stages of quantized outputs for every N stages to generate multiple digital codes, in which the time-skew calibration circuit is further configured to calibrate a time skew of the analog-to-digital converting system according to a comparison result between the multiple digital codes and a reference code.

Some aspects of the present disclosure provide a computer program product, stored in a memory device of an analog-to-digital converting system, and allowing the analog-to-digital converting system to execute a time-skew calibrating operation, in which the analog-to-digital converting system comprises multiple stages of analog-to-digital converters operating according to multiple interleaved clock signals, respectively, and the time-skew calibration calibrating operation comprises: using the analog-to-digital converting system to sample a test signal with a sampling frequency such that the multiple stages of ADCs generate multiple stages of quantized outputs, respectively, in which the test signal has a first frequency, and the sampling frequency is N times the first frequency, where N is an odd number larger than 1; sequentially analyzing the multiple stages of quantized outputs for every N stages to generate multiple digital codes; and calibrating a time skew of the analog-to-digital converting system according to a comparison result between the multiple digital codes and a reference code.

One of advantages of the embodiments mentioned above is that there is no need for an additional reference circuit as a calibration reference.

Another advantage of the embodiments mentioned above is that the time skew can be calibrated with simple logic operations.

It is to be understood that both the foregoing general description and the following detailed description are by examples, and are intended to provide further explanation of the disclosure as claimed.

DETAILED DESCRIPTION

Figure 1:
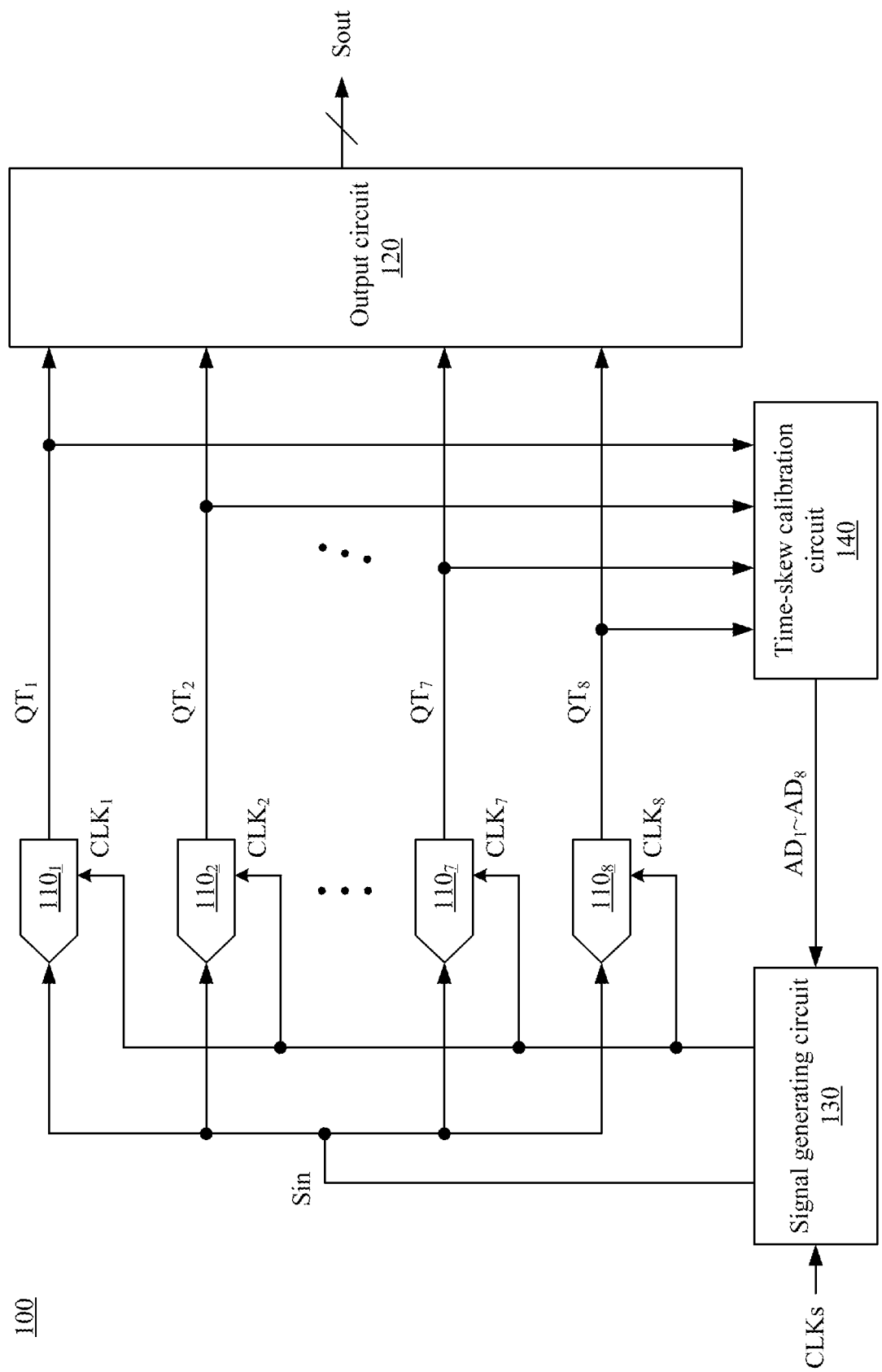
FIG. 1 is a simplified function block diagram of an analog-to-digital converting system, in accordance with an embodiment of the present disclosure.

The embodiments of the present disclosure will be described below in conjunction with related drawings. In the drawings, the same reference numerals indicate the same or similar elements or method process.

FIG. 1 is a simplified function block diagram of an analog-to-digital converting system 100, in accordance with an embodiment of the present disclosure. The analog-to-digital converting system 100 comprises multiple stages of analog-to-digital converters (ADCs) $110_1$~$110_8$, an output circuit 120, a signal generating circuit 130 and a time-skew calibration circuit 140. The multiple stages of the ADCs $110_1$~$110_8$ sample a test signal Sin according to multiple interleaved clock signals $CLK_1$~$CLK_8$, respectively, so as to generate multiple stages of quantized outputs $QT_1$~$QT_8$. Operations of the ADCs $110_1$~$110_8$ render the analog-to-digital converting system 100 have a sampling frequency fs.

Figure 2:
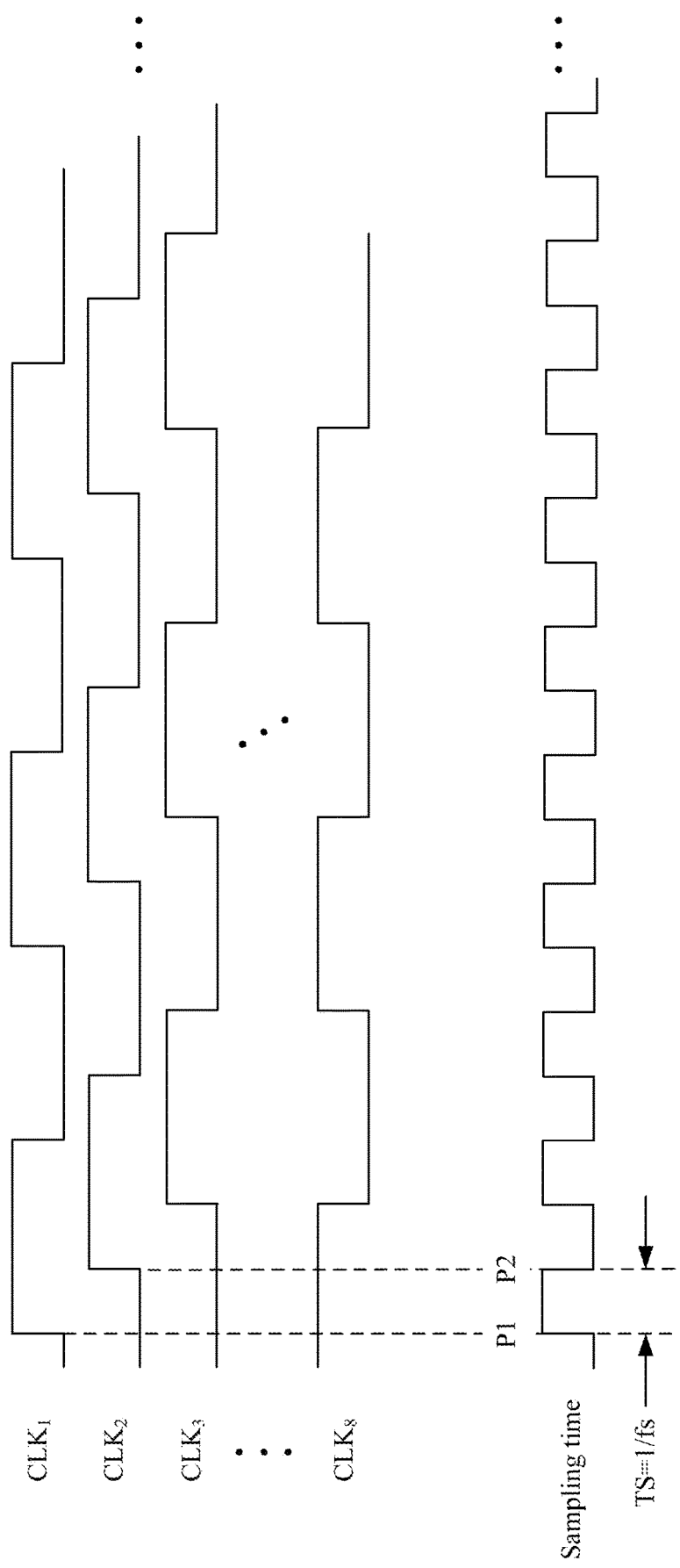
FIG. 2 is a schematic diagram of waveforms of multiple clock signals illustrated in FIG. 1, in accordance with an embodiment of the present disclosure.

FIG. 2 is a schematic diagram of waveforms of multiple clock signals illustrated in FIG. 1, in accordance with an embodiment of the present disclosure. In some embodiments, as shown in FIG. 2, there is a time interval between each of the clock signals $CLK_1$~$CLK_8$, such that the ADCs $110_1$~$110_8$ execute sampling and analog-to-digital conversion at different time points, i.e., the analog-to-digital converting system 100 may be a time-interleaved analog-to-digital converting system. For instance, the ADC $110_1$ and the ADC $110_2$ conduct sampling and analog-to-digital conversion to the test signal Sin at a time point P1 and a time point P2, respectively. A difference between the time point P1 and the time point P2 is a sampling period TS, and the sampling period TS is a reciprocal of the sampling frequency fs (i.e., TS=1/fs). In practice, the test signal Sin may be a sine wave signal, a triangle wave signal, a square wave signal, or other suitable types of periodic signals.

Number of the ADCs $110_1$~$110_8$ in the present disclosure and diagrams is only an exemplary embodiment for ease of understanding, and is not limited thereto. In some embodiments, the analog-to-digital converting system 100 may comprise M stages of the ADCs 110, in which M is a power of 2, and various time-skew calibrating operations and a time-skew calibration method 600 described later are also applied to the analog-to-digital converting system 100 comprising M stages of the ADCs 110. In addition, a reference component numeral or a reference signal numeral in the description of the present disclosure without using the subscript index means that the reference component numeral or the reference signal numeral refers to any non-specific component or signal in the corresponding component group or signal group.

Reference is now made to FIG. 1 again, the output circuit 120 is coupled to the ADCs $110_1$~$110_8$, and is configured to receive the quantized outputs $QT_1$~$QT_8$. The output circuit 120 executes data combination operation according to the quantized outputs $QT_1$~$QT_8$ so as to generate a digital signal Sout having the sampling frequency fs. In some embodiments, the output circuit 120 may be implemented by a multiplexer, a field programmable gate array (FPGA) and/or a digital signal processor (DSP).

The signal generating circuit 130 is configured to generate the test signal Sin and the clock signals $CLK_1$~$CLK_8$ according to a source clock signal CLKs. The test signal Sin has a first frequency fo, and the sampling frequency fs is N times the first frequency fo, where N is an odd number greater than 1.

In some embodiments, a frequency of the source clock signal CLKs is N times the first frequency fo. In some other embodiments, a frequency of the clock signals CLK may be one of M (1/M) of the frequency of the source clock signal CLKs, where M is a stage number of the ADCs 110 in the analog-to-digital converting system 100. For instance, each frequency of the clock signals $CLK_1$~$CLK_8$ may be one-eighth of the source clock signal CLKs. In practice, the signal generating circuit 130 may include one or more of a filter circuit, a phase lock loop or a delay lock loop.

The time-skew calibration circuit 140 is coupled to the ADCs $110_1$~$110_8$, and configured to receive and analyze the quantized outputs $QT_1$~$QT_8$. The time-skew calibration circuit 140 is configured to sequentially analyze the multiple stages of the quantized outputs $QT_1$~$QT_8$ for every N stages to generate multiple digital codes. For instance, when N is 3, the time-skew calibration circuit 140 may generate a corresponding digital code according to a voltage value of the quantized output $QT_1$ first. Next, another corresponding digital code is generated according to a voltage value of the quantized output $QT_4$, and then another corresponding digital code is generated according to a voltage value of the quantized output $QT_7$, and so on. The calibration circuit 140 is further configured to compare the obtained multiple digital codes with a reference code Cref to generate a comparison result, and calibrate the time skew of the analog-to-digital converting system 100 according to the comparison result. Further details for calibrating operations will be explained in the followings.

In some embodiments, the quantized outputs $QT_1$~$QT_8$ first go through an offset calibration and/or gain calibration, then is provided to the output circuit 120 and the time-skew calibration circuit 140. For the sake of brevity, other calibration circuits related are not shown in FIG. 1.

Figure 3:
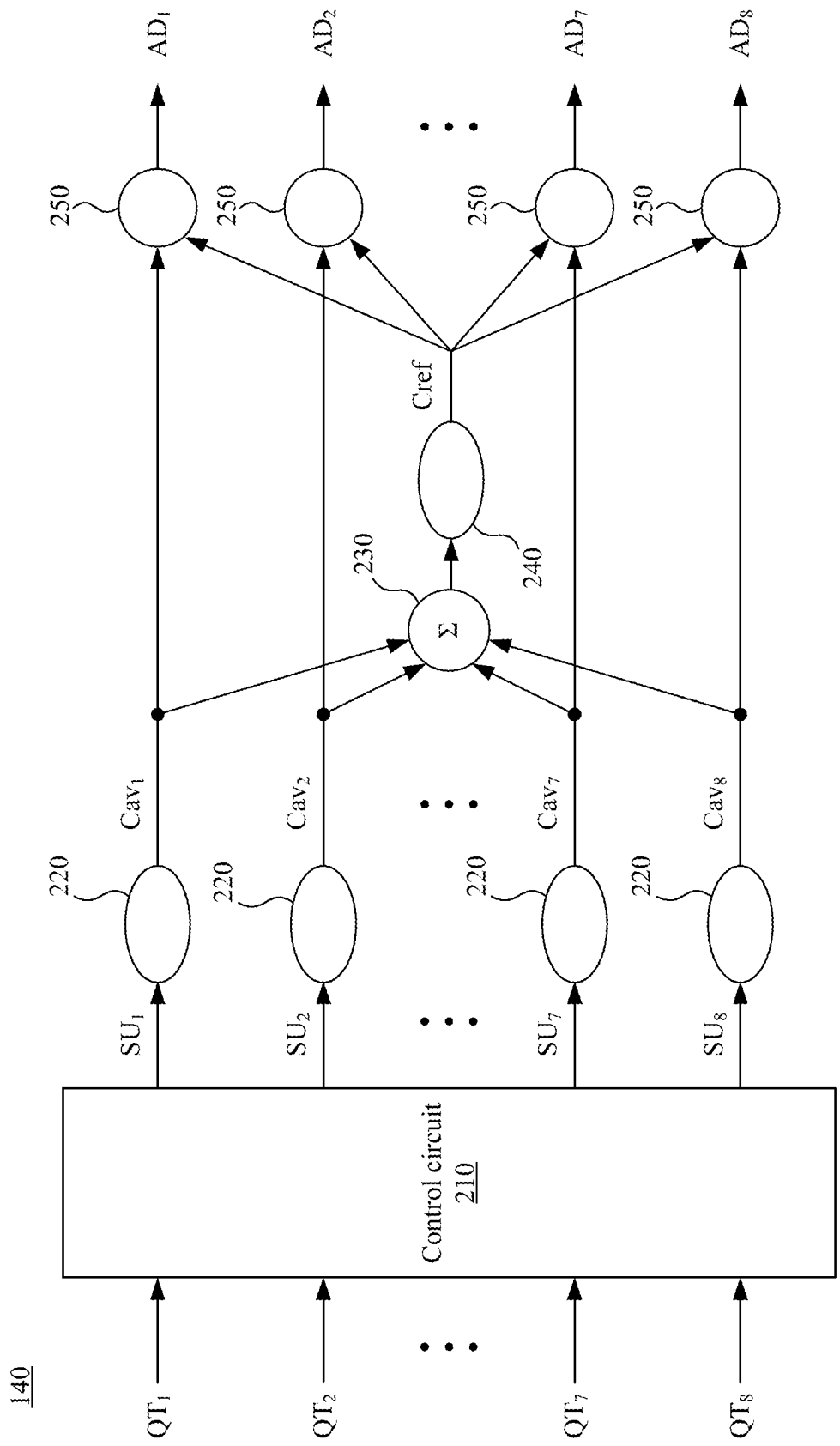
FIG. 3 is a simplified function block diagram of a time-skew calibration circuit, in accordance with an embodiment of the present disclosure.
Figure 4:
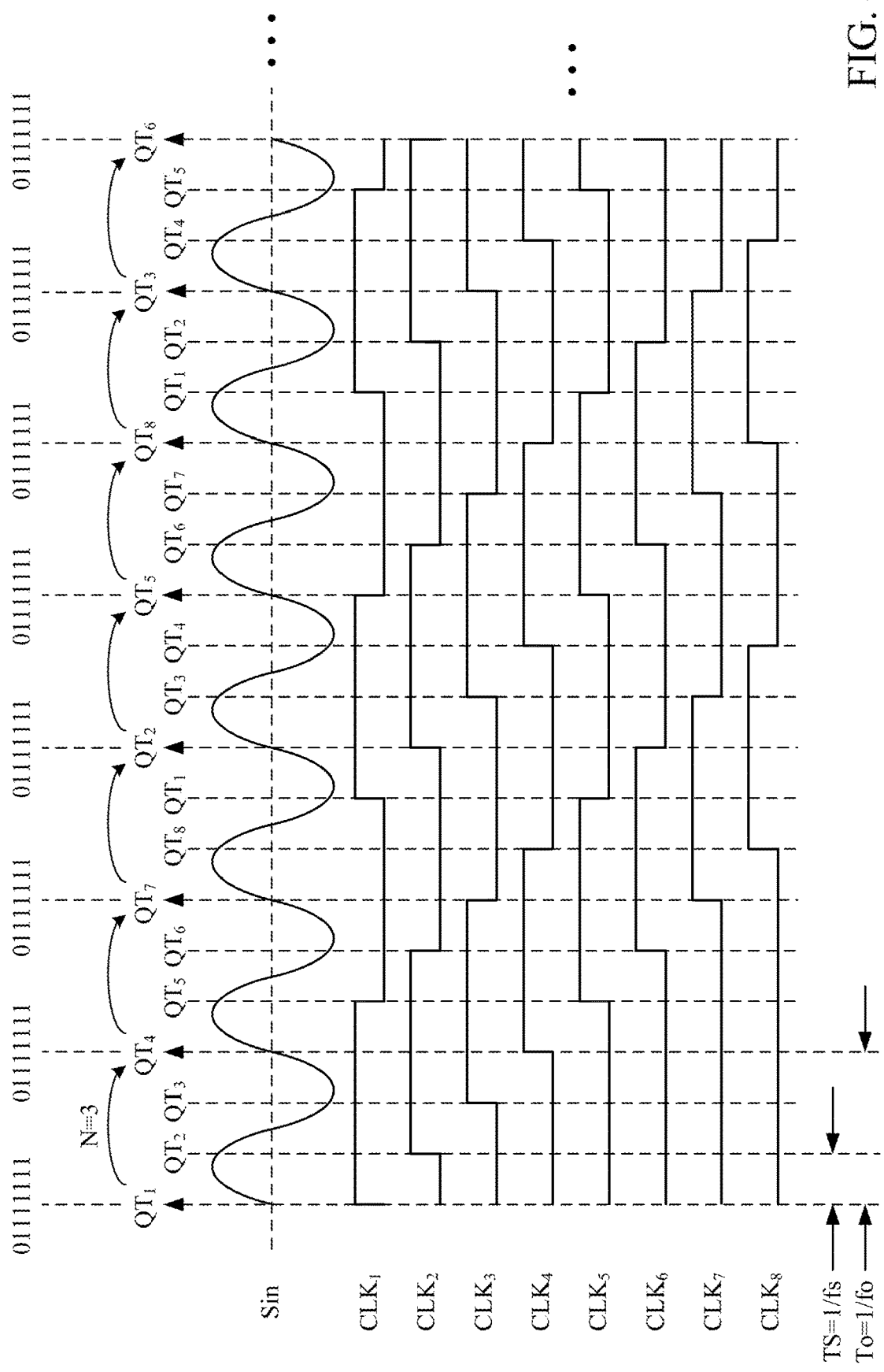
FIG. 4 is a schematic diagram of an analysis process for the time-skew calibration circuit analyzing a test signal, in accordance with an embodiment of the present disclosure.

FIG. 3 is a simplified function block diagram of a time-skew calibration circuit, in accordance with an embodiment of the present disclosure. FIG. 4 is a schematic diagram for illustrating an analysis process performed by the time-skew calibration circuit 140 to the test signal Sin, in accordance with an embodiment of the present disclosure. The time-skew calibration circuit 140 includes a control circuit 210, multiple first dividing circuits 220, an addition circuit 230, a second dividing circuits 240 and multiple comparing circuits 250. In some embodiments, reference is now made to FIG. 3 and FIG. 4 at the same time, the test signal Sin has a first period To, and the first period To is a reciprocal of the first frequency fo (i.e., To=1/fo). Because the sampling frequency fs is N times (e.g., 3 times) the first frequency fo, the analog-to-digital converting system 100 samples the test signal Sin N times (e.g., 3 times) in the first period To by using the ADCs $110_1$~$110_8$. For ease of understanding, the following paragraphs will use N is equal to 3 as an example to illustrate the operation of the time-skew calibration circuit 140, but this disclosure is not limited thereto.

To calibrate the time-skew phenomenon, the control circuit 210 sequentially analyzes the quantized outputs $QT_1$~$QT_8$ for every N stages (e.g., 3 stages) to generate multiple digital codes. For instance, when N is 3, the control circuit 210 may sequentially analyze voltage values of the quantized outputs $QT_1$, $QT_4$, $QT_7$, $QT_2$, $QT_5$, $QT_8$, $QT_3$ and $QT_6$, and then analyze the voltage value of the quantized output $QT_1$ again so as to generate corresponding digital codes according to the voltage values, respectively. In other words, the control circuit 210 may neglect the quantized outputs $QT_2$ and $QT_3$ during the analyzation of the quantized outputs $QT_1$ and $QT_4$, and may neglect the quantized outputs $QT_5$ and $QT_6$ during the analyzation of the quantized outputs $QT_4$ and $QT_7$, and so on. The circuit 210 may analyze the quantized outputs $QT_1$~$QT_8$ multiple times and cyclically according to the sequence mentioned above.

Because the sampling frequency fs is N times (e.g., 3 times) the first frequency fo, by analyzing the quantized outputs $QT_1$~$QT_8$ for every N stages (e.g., 3 stages), the control circuit 210 sequentially generates multiple digital codes that are substantially the same. For instance, as shown in FIG. 4, the control circuit 210 sequentially generates same multiple digital codes 01111111 according to the quantized outputs $QT_1$, $QT_4$, $QT_7$, $QT_2$, $QT_5$, $QT_8$, $QT_3$ and $QT_6$. In such way, by simply checking whether there are variations in the digital codes, generated by the control circuit 210, that are ideally substantially the same, whether the time-skew phenomenon occurs or not can be confirmed. Therefore, other circuits of the time-skew calibration circuit 140 may be implemented by simple logic operation circuits. Further details of the checking process will be explained in the following paragraphs.

In some embodiments, because the total stage number of the quantized outputs $QT_1$~$QT_8$ (i.e., the total stage number of the ADCs $110_1$~$110_8$) is a power of 2 and N is an odd number, even if the control circuit 210 conducts analysis in intervals, the control circuit 210 can analyze each of the quantized outputs $QT_1$~$QT_8$ without any unanalyzed quantized output QT. For instance, the quantized outputs $QT_2$ and $QT_3$ that are neglected between the analyzation of the quantized outputs $QT_1$ and $QT_4$ are analyzed, respectively, after finishing analyzing the quantized outputs $QT_7$ and $QT_8$. In another example, the quantized outputs $QT_5$ and $QT_6$ that are neglected between the analyzation of the quantized outputs $QT_4$ and $QT_7$ are analyzed, respectively, after finishing analyzing the quantized outputs $QT_2$ and $QT_3$, and so on. In such way, there will be no ADCs 110 that are left not calibrated.

In other words, when the control circuit 210 analyze a quantized output $QT_i$ generated by an i-th stage ADC $110_i$ to generate a corresponding digital code, if (i+N) is smaller than or equal to the total stage number M of the ADCs 110 in the analog-to-digital converting system 100, then the control circuit 210 proceeds to analyze a quantized output $QT_{i+N}$ generated by an (i+N)-th stage ADC $110_{i+N}$, in which i and M are positive integers. On the other hand, when the control circuit 210 analyze the quantized output $QT_i$ generated by the i-th stage ADC $110_i$ to generate the corresponding digital code, if (i+N) is greater than M, then the control circuit 210 analyze a quantized output $QT_{i+N-M}$ generated by an (i+N−M)-th stage ADC $110_{i+N-M}$. In some embodiments, the control circuit 210 may analyze cyclically according to the above rules until the control circuit 210 generates at least one digital code for each quantized output QT.

The control circuit 210 further sums up one or more digital codes corresponding to each of the quantized outputs $QT_1$~$QT_8$ to generate multiple sum-up values $SU_1$~$SU_8$ corresponding to the ADCs $110_1$~$110_8$, respectively. For instance, in the process of repeatedly analyzing (e.g., 4 times) the quantized outputs $QT_1$~$QT_8$, the control circuit 210 generates four digital codes with the same number 01111111 according to the quantized output $QT_1$, then the control circuit 210 sums up the four digital codes to obtain a sum-up value $SU_1$ of 111111100. For another example, in the process of repeatedly analyzing (e.g., 4 times) the quantized outputs $QT_1$~$QT_8$, the control circuit 210 also generate four digital codes with the same number 01111111 according to the quantized output $QT_4$, and the control circuit 210 sums up the four digital codes to obtain a sum-up value $SU_4$ of 111111100, and so on.

Next, the control circuit 210 outputs the sum-up values $SU_1$~$SU_8$ to multiple first dividing circuits 220, respectively, to average the sum-up values $SU_1$~$SU_8$ to obtain multiple average codes $Cav_1$~$Cav_8$, respectively. A divisor of each first dividing circuits 220 may be configured as the times that the control circuit 210 repeatedly analyzes the quantized outputs $QT_1$~$QT_8$, e.g., 4 times aforementioned, but the present disclosure is not limited thereto. In some embodiments, the averaging operation of the first dividing circuits 220 is configured to eliminate background noises.

The addition circuit 230 is configured to sum up the average codes $Cav_1$~$Cav_8$, and output the sum-up result to the second dividing circuit 240. The second dividing circuit 240 is configured to average the sum-up result of the average codes $Cav_1$~$Cav_8$ so as to generate the reference code Cref. A divisor of the second dividing circuits 240 may be configured as the number of ADCs $110_1$~$110_8$, but the present disclosure is not limited thereto.

The multiple comparing circuits 250 are configured to receive the average codes $Cav_1$~$Cav_8$. Each of the comparing circuit 250 is configured to compare a corresponding one of the average codes $Cav_1$~$Cav_8$ with the reference code Cref so as to generate multiple calibration signals $AD_1$~$AD_8$, in which the calibration signals $AD_1$~$AD_8$ are configured to calibrate the ADCs $110_1$~$110_8$.

If one of the ADCs $110_1$~$110_8$ is not affected by the time skew, the corresponding average code Cav of the un-affected ADC 110 is substantially the same as the reference code Cref.

On the other hand, if one of the ADCs $110_1$~$110_8$ is affected by the time skew, the affected ADC 110 outputs a variant quantized outputs QT due to incorrect sampling time, causing difference between the corresponding average code Cav thereof and the reference code Cref in which this difference will be reflected in the corresponding calibration signal AD.

For instance, if the average code $Cav_1$ and the reference code Cref are the same, the corresponding comparing circuit 250 may configure the calibration signal $AD_1$ as a specific logic value (e.g., logic 1). As another example, if the average code $Cav_1$ and the reference code Cref are not the same, the calibration signal $AD_1$ may be configured as another opposite logic value (e.g., logic 0).

Reference is now made to FIG. 1 again, the calibration signals $AD_1$~$AD_8$ are provided to the signal generating circuit 130. In some embodiments, the calibration signals $AD_1$~$AD_8$ may be configured to adjust an operation voltage of an oscillator of the phase lock loop in the signal generating circuit 130. For example, an output phase of the oscillator is adjusted by increasing or decreasing a fixed value of the operation voltage of the oscillator. In some other embodiments, the calibration signals $AD_1$~$AD_8$ may be configured to adjust an operation voltage of a delay line of the delay lock loop in the signal generating circuit 130. For instance, an amount of delay of the delay line is adjusted by increasing or decreasing a fixed value of the operation voltage of the delay line. In such way, the time-skew phenomenon of the analog-to-digital converting system 100 is calibrated.

Figure 5:
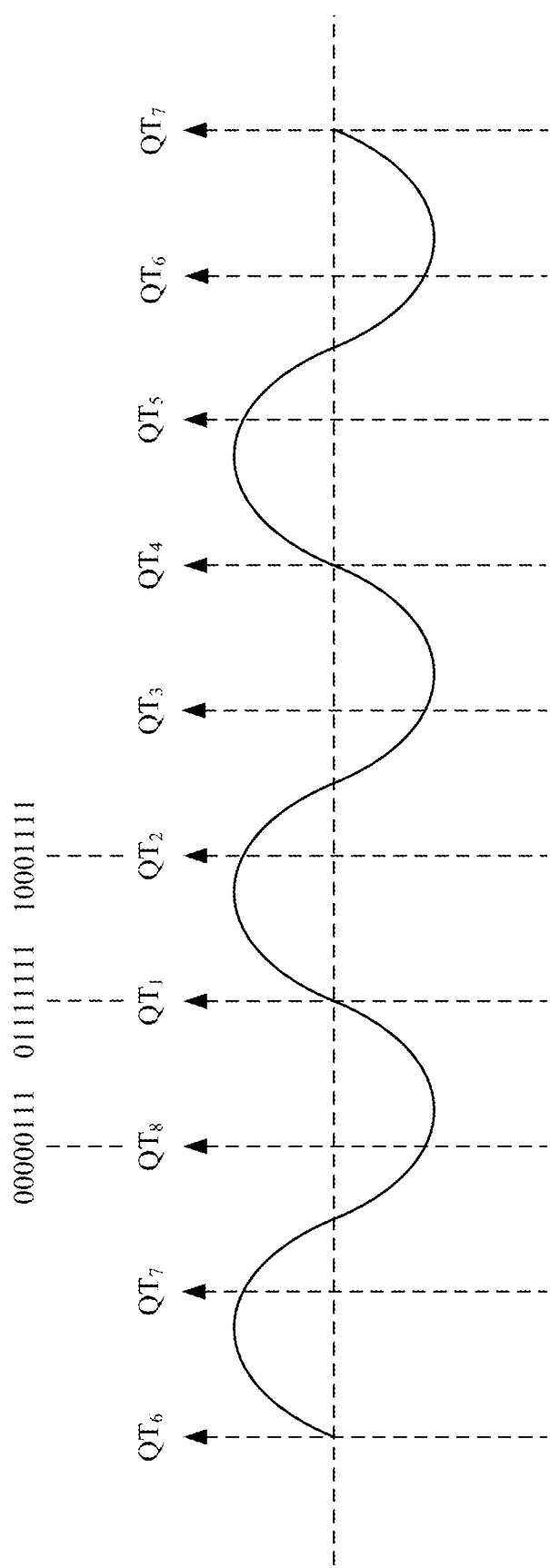
FIG. 5 is a schematic diagram of a selecting process for the time-skew calibration circuit selecting analysis starting point, in accordance with an embodiment of the present disclosure.

FIG. 5 is a schematic diagram of a selecting process which the time-skew calibration circuit selects an analysis starting point, in accordance with an embodiment of the present disclosure. In some embodiments, before the time-skew calibration circuit 140 starts to sequentially analyze the quantized outputs $QT_1$~$QT_8$ for every N stages, the time-skew calibration circuit 140 analyzes a trend of magnitude variations for the multiple digital codes corresponding to the quantized outputs $QT_1$~$QT_8$ in a way of non-intervals (or N equals to 1). The time-skew calibration circuit 140 will identify multiple digital codes that are sequentially increasing, and the quantized output QT (or the ADC 110) corresponding to one of these multiple digital codes having an intermediate value is used as a starting point for sequentially analyzing the quantized outputs $QT_1$~$QT_8$ for every N stages.

For instance, the time-skew calibration circuit 140 identifies three digital codes 00000111, 01111111 and 11111100 that are sequentially increasing, and correspond to the quantized outputs $QT_8$, $QT_1$ and $QT_2$, respectively. Therefore, the time-skew calibration circuit 140 starts to sequentially analyze the quantized outputs $QT_1$~$QT_8$ for every N stages by selecting the quantized output $QT_1$ (i.e., ADC $110_1$) as the starting point.

Similarly, in some other embodiments, the time-skew calibration circuit 140 identifies multiple digital codes that are sequentially decreasing, and the quantized output QT corresponding to one of these multiple digital codes having an intermediate value is used as a starting point for sequentially analyzing the quantized outputs $QT_1$~$QT_8$ for every N stages.

When a waveform of the test signal Sin is known, by choosing the starting point according to above mentioned method, the analog-to-digital converting system 100 may determine a direction of the time skew according to the difference between the average code Cav and the reference code Cref. For instance, if the time skew causes the ADC $110_1$ to sample in a later time, the corresponding average code $Cav_1$ is greater than the reference code Cref. As another example, if the time skew causes the ADC $110_1$ to sample early, the corresponding average code $Cav_1$ is smaller than the reference code Cref.

In addition, a phenomenon of the digital codes sequentially increasing or decreasing is caused by a steeper part of the waveform of the test signal Sin. Choosing the steeper part of the waveform to analyze may make the time skew phenomenon easy to be observed.

In various embodiments mentioned above, N may be an odd number greater than or equal to 3 and smaller than or equal to 7. Since the first frequency fo is one of N (1/N) of the frequency of the source clock signal CLKs, when N becomes smaller, the first frequency fo becomes higher, such that the test signal Sin has a lager rising and falling slope, and the time-skew phenomenon is further easy to be observed. Therefore, decreasing the value of N helps to improve calibration accuracy of the time skew. On the other hand, the signal generating circuit 130 needs higher accuracy and reliability for providing the test signal Sin that is rapidly changing. Therefore, increasing the value of N helps to reduce complexity and design difficulty of the analog-to-digital converting system 100.

In various embodiments mentioned above, components and function blocks in the time-skew calibration circuit 140 may be implemented by actual manufactured circuits, by a computer program product stored in a memory device (not shown) of the analog-to-digital converting system 100, or by combinations of the actual manufactured circuits and computer program product. When one or more processors (not shown) in the analog-to-digital converting system 100 execute the above mentioned computer program product, the computer program product allows the analog-to-digital converting system 100 to execute the time-skew calibrating operation mentioned in various embodiments aforementioned.

In some embodiments, when the analog-to-digital converting system 100 completes the time-skew calibration, the analog-to-digital converting system 100 may switch all receive terminals of the ADCs 110 to receive other input signals to be processed by analog-to-digital conversion, e.g., WiFi, Bluetooth, 4G, or other signals of more advanced communication protocols.

Figure 6:
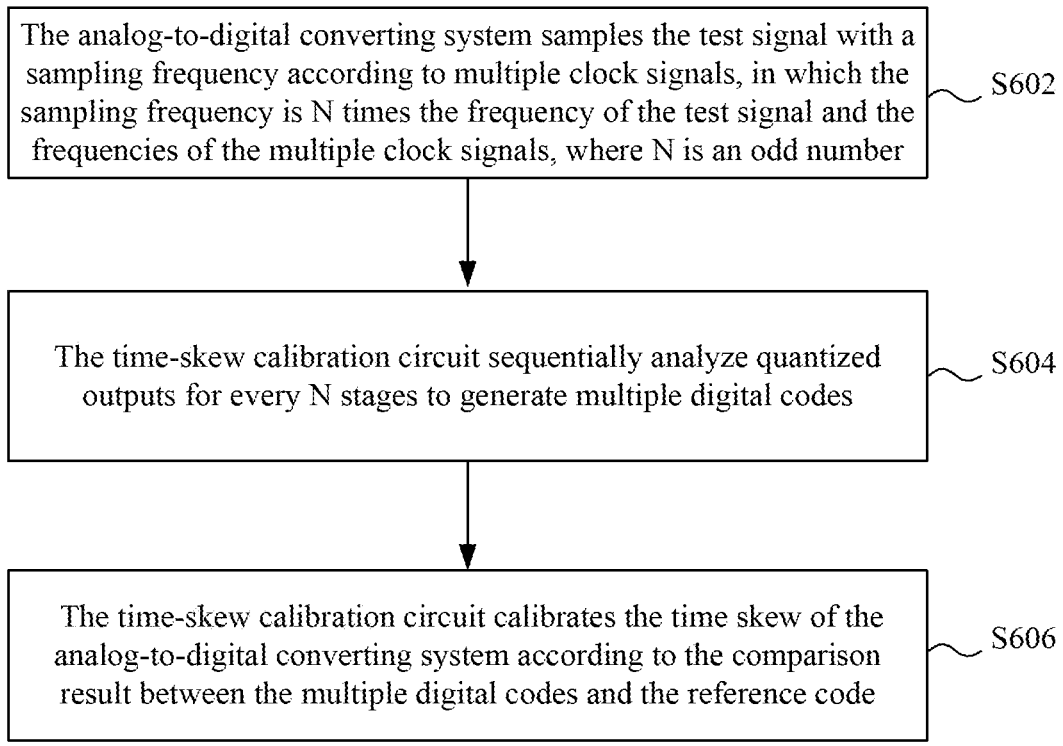
FIG. 6 is a flow chart of time-skew calibration method, in accordance with an embodiment of the present disclosure.

FIG. 6 is a flow chart of time-skew calibration method 600, in accordance with an embodiment of the present disclosure. The time-skew calibration method 600 is applied to the analog-to-digital converting system 100 of various embodiments mentioned above, and includes steps S602-S606 below. In step S602, the analog-to-digital converting system 100 samples the test signal Sin with the sampling frequency fs. As shown in FIG. 1 and FIG. 2, the ADCs $110_1$~$110_8$ sample the test signal Sin according to the clock signals $CLK_1$~$CLK_8$, respectively, to generate the quantized outputs $QT_1$~$QT_8$, respectively, in which the sampling frequency fs is N times the frequency of the test signal Sin, and N is an odd number greater than 1.

In step S604, as shown in FIG. 3 and FIG. 4, the time-skew calibration circuit 140 sequentially analyze the quantized outputs $QT_1$~$QT_8$ for every N stages to generate multiple digital codes. Since the stage number of the ADCs $110_1$~$110_8$ is a power of 2 and N is an odd number, each of the quantized outputs $QT_1$~$QT_8$ is used to generate one or more of the multiple digital codes without any quantized outputs $QT_1$~$QT_8$ being left unanalyzed.

In step S606, the time-skew calibration circuit 140 calibrates the time skew of the analog-to-digital converting system 100 according to the comparison result between the multiple digital codes and the reference code Cref. As shown in FIG. 3, one or more digital codes corresponding to each of the quantized outputs $QT_1$~$QT_8$ are summed and averaged to generate the average codes $Cav_1$~$Cav_8$ corresponding to the ADCs $110_1$~$110_8$. The time-skew calibration circuit 140 will further average the average codes $Cav_1$~$Cav_8$ to generate the reference code Cref.

Based on the foregoing, an additional reference circuit as a calibration reference is not needed in the analog-to-digital converting system 100, and the time skew can be calibrated by the analog-to-digital converting system 100 through simple sum, average and comparison operations.

Therefore, the analog-to-digital converting system 100 has advantages of small circuit area, fast calibration speed and easy to design. The time-skew calibration method 600 also has similar advantages, which will not be repeated here.

Certain terms used in the specification and the scope of the patent application are referred to specific elements. However, those skilled in the art should understand that the same element may be referred to different terms. The specification and the scope of the patent application should not use the difference in terms as a way of distinguishing elements, but the difference in function of elements. The terms "including", "comprising", "having", "containing" and the like, as used herein, are all open-ended terms, meaning "including but not limited to". In addition, the term "coupling" as used herein, includes any direct and indirect connection means. Therefore, if it is described in the text that the first element is coupled to the second element, it means that the first element may be directly connected to the second element through electrical connection, wireless transmission, optical transmission, or other signal connections, or may be electrically connected to the second element indirectly, through other elements or connection means.

The description "and/or" used herein includes any combination of one or more of the listed items. Furthermore, any term in the singular case also includes the meaning of the plural case, unless otherwise specified in the specification.

While the disclosure has been described by way of example(s) and in terms of the preferred embodiment(s), it is to be understood that the disclosure is not limited thereto. Those skilled in the art may make various changes, substitutions, and alterations herein without departing from the spirit and scope of the present disclosure. In view of the foregoing, it is intended that the present invention cover modifications and variations of this invention provided they fall within the scope of the following claims.

What is claimed is:

1. A time-skew calibration method configured to calibrate an analog-to-digital converting system, wherein the analogto-digital converting system comprises a plurality of stages of analog-to-digital converters (ADCs) operating according to a plurality of interleaved clock signals, respectively, and the time-skew method comprises:

using the analog-to-digital converting system to sample a test signal with a sampling frequency such that the plurality of stages of ADCs generate a plurality of stages of quantized outputs, respectively, wherein the test signal has a first frequency, and the sampling frequency is N times the first frequency, where N is an odd number larger than 1;

sequentially analyzing the plurality of stages of quantized outputs for every N stages to generate a plurality of digital codes; and calibrating a time skew of the analog-to-digital converting system according to a comparison result between the plurality of digital codes and a reference code.

2. The time-skew calibration method of claim 1, wherein sequentially analyzing the plurality of stages of quantized outputs for every N stages to generate the plurality of digital codes comprises:

analyzing one of the plurality of stages of quantized outputs generated by an i-th stage ADC to generate a corresponding one of the plurality of digital codes, wherein i is a positive integer;

when (i+N) is smaller than or equal to M, proceeding to analyze one of the plurality of stages of quantized outputs generated by an (i+N)-th stage ADC to generate another corresponding one of the plurality of digital codes, wherein M is a total stage number of the plurality of stages of ADCs; and when (i+N) is larger than M, proceeding to analyze one of the plurality of stages of quantized outputs generated by an (i+N−M)-th stage ADC to generate yet another corresponding one of the plurality of digital codes.

3. The time-skew calibration method of claim 2, wherein sequentially analyzing the multiple stages of quantized outputs for every N stages to generate the plurality of digital codes further comprises:

sequentially analyzing the plurality of stages of quantized outputs from a j-th stage ADC for every N stages, wherein j is a positive integer, and three of the plurality of digital codes corresponding to a (j−1)-th stage ADC, the j-th stage ADC and a (j+1)-th stage ADC sequentially increase or decrease.

4. The time-skew calibration method of claim 1, wherein each of the plurality of stages of quantized outputs is used to generate one or more digital codes of the plurality of digital codes, and calibrating the time-skew of the analog-to-digital converting system comprises:

averaging the one or more digital codes generated according to each of the plurality of stages of quantized outputs to obtain a plurality of average codes that correspond respectively to the plurality of stages of ADCs; and averaging the plurality of average codes to generate the reference code.

5. The time-skew calibration method of claim 4, wherein calibrating the time-skew of the analog-to-digital converting system further comprises:

comparing each of the plurality of average codes with the reference code to generate a plurality of calibration signals that correspond respectively to the plurality of stages of ADCs; and calibrating the plurality of stages of ADCs accordingly, according to the plurality of calibration signals.

6. The time-skew calibration method of claim 1, wherein the plurality of digital codes are substantially the same.

7. The time-skew calibration method of claim 1, further comprising:

generating the test signal according to a source clock signal, wherein a frequency of the source clock signal is N times the first frequency.

8. An analog-to-digital converting system, comprising:

a plurality of stages of analog-to-digital converters (ADCs), configured to sample a test signal according to a plurality of interleaved clock signals, respectively, so as to generate a plurality of stages of quantized outputs, respectively, wherein an operation of the plurality of stages of ADCs renders the analog-to-digital converting system have a sampling frequency, the test signal has a first frequency, and the sampling frequency is N times the first frequency, where N is an odd number larger than 1;

a time-skew calibration circuit, configured to sequentially analyze the plurality of stages of quantized outputs for every N stages to generate a plurality of digital codes; wherein the time-skew calibration circuit is further configured to calibrate a time skew of the analog-to-digital converting system according to a comparison result between the plurality of digital codes and a reference code.

9. The analog-to-digital converting system of claim 8, wherein the time-skew calibration circuit comprises:

a control circuit, configured to analyze the plurality of stages of quantized outputs for every N stages to generate the plurality of digital codes; wherein in a circumstance that the control circuit analyzes one of the plurality of stages of quantized outputs generated by an i-th stage ADC to generate a corresponding one of the plurality of digital codes, if (i+N) is smaller than or equal to M, the control circuit proceeds to analyze one of the plurality of stages of quantized outputs generated by an (i+N)-th stage ADC to generate another corresponding one of the plurality of digital codes, wherein M is a total stage number of the plurality of stages of ADCs, and i is a positive integer, and if (i+N) is larger than M, the control circuit proceeds to analyze one of the plurality of stages of quantized outputs generated by an (i+N−M)-th stage ADC to generate yet another corresponding one of the plurality of digital codes.

10. The analog-to-digital converting system of claim 9, wherein the control circuit is configured to sequentially analyze the plurality of stages of quantized outputs from a j-th stage ADC for every N stages, and j is a positive integer, wherein three of the plurality of digital codes corresponding to a (j−1)-th stage ADC, the j-th stage ADC and a (j+1)-th stage ADC sequentially increase or decrease.

11. The analog-to-digital converting system of claim 9, wherein each of the plurality of stages of quantized outputs is used to generate one or more digital codes of the plurality of digital codes, and the control circuit is further configured to sum up the one or more digital codes generated according to each of the plurality of stages of quantized outputs to obtain a plurality of add-up values that correspond respectively to the plurality of stages of ADCs, and the time-skew calibration circuit further comprises:

a plurality of first dividing circuits, configured to average the plurality of add-up values, respectively, to obtain a plurality of average codes that correspond respectively to the plurality of stages of ADCs;

an addition circuit, configured to sum up the plurality of average codes to obtain a sum-up result;

a second dividing circuits, configured to average the sum-up result to obtain the reference code; and a plurality of comparing circuits, configured to compare each of the plurality of average codes with the reference code to generate a plurality of calibration signals that correspond respectively to the plurality of stages of ADCs, wherein the plurality of calibration signals are configured to calibrate the plurality of stages of ADCs accordingly.

12. The analog-to-digital converting system of claim 8, wherein the plurality of digital codes are substantially the same.

13. The analog-to-digital converting system of claim 8, further comprising:

a signal generating circuit, configured to generate the test signal according to a source clock signal, wherein a frequency of the source clock signal is N times the first frequency.

14. A computer program product, stored in a memory device of an analog-to-digital converting system, and allowing the analog-to-digital converting system to execute a time-skew calibrating operation, wherein the analog-to-digital converting system comprises a plurality of stages of analog-to-digital converters (ADCs) operated according to a plurality of interleaved clock signals, respectively, and the time-skew calibrating operation comprises:

using the analog-to-digital converting system to sample a test signal with a sampling frequency such that the plurality of stages of ADCs generate a plurality of stages of quantized outputs, respectively, wherein the test signal has a first frequency, and the sampling frequency is N times the first frequency, where N is an odd number larger than 1;

sequentially analyzing the plurality of stages of quantized outputs for every N stages to generate a plurality of digital codes; and calibrating a time skew of the analog-to-digital converting system according to a comparison result between the plurality of digital codes and a reference code.

15. The computer program product of claim 14, wherein when sequentially analyzing the plurality of stages of quantized outputs for every N stages to generate the plurality of digital codes, the time-skew calibrating operation comprises:

analyzing one of the plurality of stages of quantized outputs generated by an i-th stage ADC to generate a corresponding one of the plurality of digital codes, wherein i is a positive integer;

when (i+N) is smaller than or equal to M, proceeding to analyze one of the plurality of stages of quantized outputs generated by an (i+N)-th stage ADC to generate another corresponding one of the plurality of digital codes, wherein M is a total stage number of the plurality of stages of ADCs; and when (i+N) is larger than M, proceeding to analyze one of the plurality of stages of quantized outputs generated by an (i+N−M)-th stage ADC to generate yet another corresponding one of the plurality of digital codes.

16. The computer program product of claim 15, wherein when sequentially analyzing the plurality of stages of quantized outputs for every N stages to generate the plurality of digital codes, the time-skew calibrating operation further comprises:

sequentially analyzing the plurality of stages of quantized outputs from a j-th stage ADC for every N stages, wherein j is a positive integer, and three of the plurality of digital codes corresponding to a (j−1)-th stage ADC, the j-th stage ADC and a (j+1)-th stage ADC sequentially increase or decrease.

17. The computer program product of claim 14, wherein each of the plurality of stages of quantized outputs is configured to generate one or more digital codes of the plurality of digital codes, and when calibrating the analog-to-digital converting system, the time-skew calibrating operation comprises:

averaging the one or more digital codes generated according to each of the plurality of stages of quantized outputs to obtain a plurality of average codes that correspond respectively to the plurality of stages of ADCs; and averaging the plurality of average codes to generate the reference code.

18. The computer program product of claim 17, wherein when calibrating the analog-to-digital converting system, the time-skew calibrating operation further comprises:

comparing each of the plurality of average codes with the reference code to generate a plurality of calibration signals that correspond respectively to the plurality of stages of ADCs; and calibrating the plurality of stages of ADCs accordingly, according to the plurality of calibration signals.

19. The computer program product of claim 14, wherein the plurality of digital codes are substantially the same.

20. The computer program product of claim 14, wherein the time-skew calibrating operation further comprises:

generating the test signal according to a source clock signal, wherein a frequency of the source clock signal is N times the first frequency.

* * * * *